(12) United States Patent
Bangalore

(10) Patent No.: US 7,472,309 B2
(45) Date of Patent: Dec. 30, 2008

(54) METHODS AND APPARATUS TO WRITE A FILE TO A NONVOLATILE MEMORY

(75) Inventor: Kiran Kumar G. Bangalore, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 634 days.

(21) Appl. No.: 11/022,193

(22) Filed: Dec. 22, 2004

(65) Prior Publication Data
US 2006/0136507 A1 Jun. 22, 2006

(51) Int. Cl.
*G06F 11/00* (2006.01)

(52) U.S. Cl. ............... 714/21; 714/22; 714/24

(58) Field of Classification Search ............ 714/21, 714/22, 24
See application file for complete search history.

(56) References Cited

U.S. PATENT DOCUMENTS

| | | | |
|---|---|---|---|
| 6,038,636 A * | 3/2000 | Brown et al. | 711/103 |
| 6,170,066 B1 | 1/2001 | See | |
| 6,226,728 B1 * | 5/2001 | See et al. | 711/171 |
| 6,549,457 B1 | 4/2003 | Srinivasan et al. | |
| 6,557,114 B2 * | 4/2003 | Mann et al. | 714/6 |
| 6,718,427 B1 * | 4/2004 | Carlson et al. | 711/5 |
| 6,985,584 B1 * | 1/2006 | Yokota et al. | 380/200 |
| 2002/0138676 A1 * | 9/2002 | Kendall et al. | 710/74 |
| 2003/0206430 A1 * | 11/2003 | Ho | 365/145 |

OTHER PUBLICATIONS

Pending U.S. Appl. No. 10/882,379, filed Jun. 30, 2004, to John C. Rudelic.
Pending U.S. Appl. No. 10/880,993, filed Jun. 30, 2004, to Jeffrey Wang, et al.
Intel Corporation, "Intel MultiMedia File Manager User's Guide", Version 1, Jun. 2004, 48 pages.

* cited by examiner

*Primary Examiner*—Emerson C Puente
(74) *Attorney, Agent, or Firm*—Trop, Pruner & Hu, P.C.

(57) ABSTRACT

A method and apparatus to write a file to a nonvolatile memory is provided. The method may include writing a file to a nonvolatile memory using at least two headers and at least two file fragments and using only information stored in one header of the at least two headers to determine if the writing of the file to the nonvolatile memory was interrupted by a loss of power. Other embodiments are described and claimed.

20 Claims, 5 Drawing Sheets

METHODS AND APPARATUS TO WRITE A FILE TO A NONVOLATILE MEMORY

BACKGROUND

Nonvolatile memories such as, for example, a flash electrically erasable programmable read-only memory ("flash EEPROM" or "flash memory") may retain their data until the memory is erased. Flash memory may be arranged as blocks of single transistor memory cells that may include a floating gate to store information. Although a flash memory is rewritable, the memory cells may not be re-programmed unless they have first been erased.

Further, the flash memory cells may only be erasable in blocks. Thus in order to erase one cell, an entire block of cells may have to be erased. Accessing a flash memory, for example, erasing a block of flash memory or writing to a flash memory may be a relatively time consuming process.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the present invention. However, it will be understood by those skilled in the art that the present invention may be practiced without these specific details. In other instances, well-known methods, procedures, components and circuits have not been described in detail so as not to obscure the present invention.

In the following description and claims, the terms "include" and "comprise," along with their derivatives, may be used, and are intended to be treated as synonyms for each other. In addition, in the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Further, "coupled" may mean that two or more elements are indirectly joined together, for example, via one or more other elements.

Figure 1:
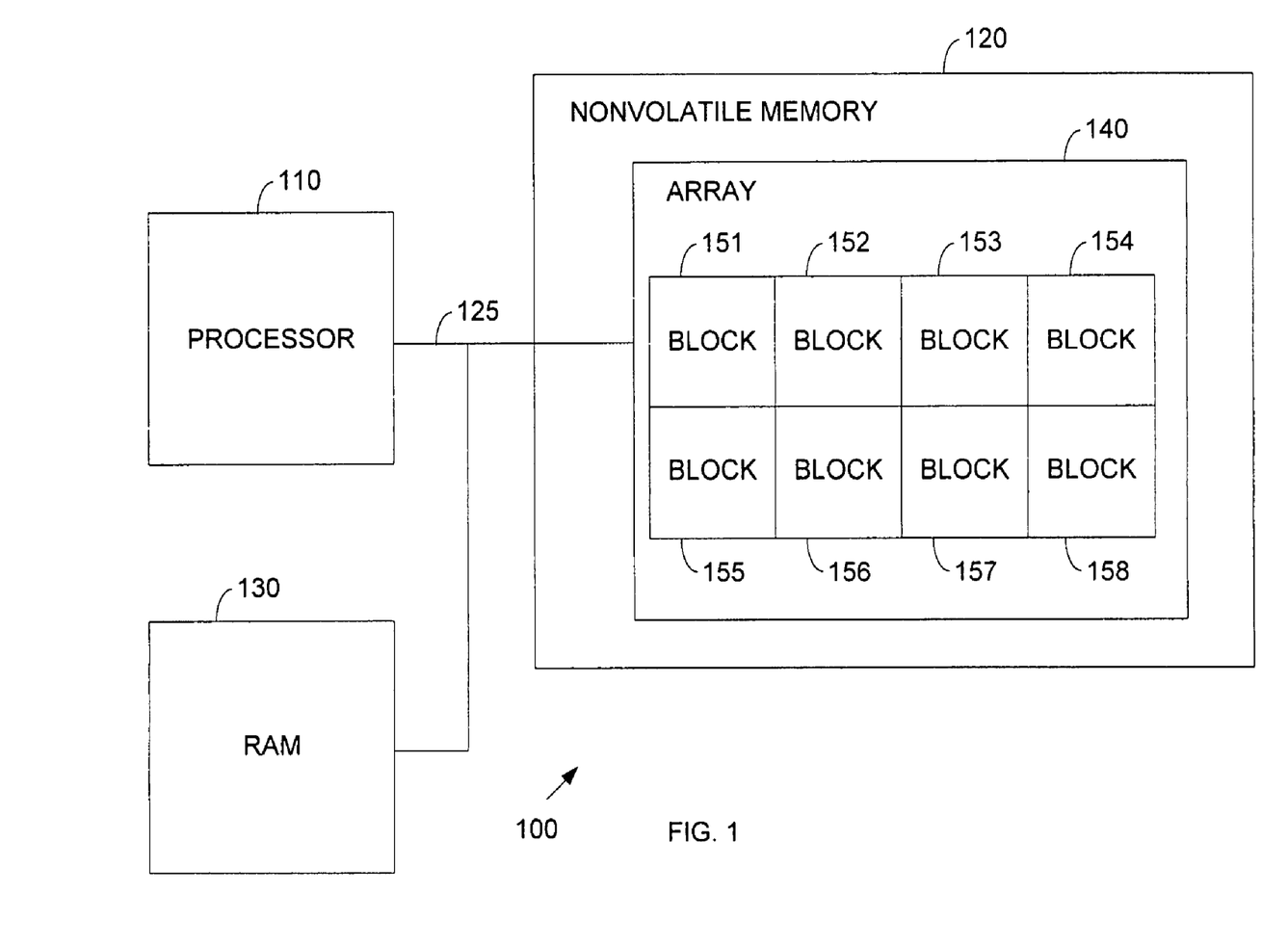
FIG. 1 is a block diagram illustrating a portion of a computing system in accordance with an embodiment of the present invention.

FIG. 1 is a block diagram illustrating a portion of a computing system 100 in accordance with an embodiment of the present invention. Although the scope of the present invention is not limited in this respect, system 100 may be used in a personal digital assistant (PDA), a wireless telephone (for example, cordless or cellular phone), a pager, a digital music player, a laptop or desktop computer, a set-top box, a printer, etc.

System 100 may include a processor 110 and a nonvolatile memory 120 coupled to processor 110 via a bus 125. In addition, system 100 may include a random access memory (RAM) 130 coupled to processor 110 and to nonvolatile memory 120 via bus 125. Bus 125 may include one or more busses and may be a single 16-bit bus in one embodiment. Although not shown, system 100 may include other components such as, for example, more processors, input/output (I/O) devices, memory devices, or storage devices. However, for simplicity these additional components have not been shown.

In one embodiment, processor 110 may be a discrete component or device and may be external to nonvolatile memory 120. Processor 110 may include digital logic to execute software instructions and may also be referred to as a central processing unit (CPU). Software instructions executed by processor 110 may be stored in nonvolatile memory 120 and may also be referred to as code.

One example of software executed by processor 110 includes memory management software that may be used to manage the storage of code, data, and files in nonvolatile memory 120. The memory management software may include code manager software, data manager software, and file manager software. The code manager software, data manager software, and file manager software may be used to respectively store and manage code, data, and files in nonvolatile memory 120.

The memory management software may also be referred to in various embodiments as code management software, data management software, file management software, file system software, file system management software, flash file management software, or a flash media manager. The memory management software may be stored in nonvolatile memory 120 and may be fetched and executed from nonvolatile memory 120 without the intermediate step of loading the code to a volatile random access memory (RAM). This is sometimes referred to as execute-in-place (XIP) in some flash memories.

Although not shown, processor 110 may include a CPU core that may comprise an arithmetic-logic unit (ALU) and registers. In one embodiment, processor 110 may be an XScale® microprocessor available from Intel® Corporation (both XScale and Intel are a registered trademarks of Intel Corporation). The XScale® microprocessor may be a 32-bit microprocessor that may include an ARM based core, although the scope of the present invention is not limited in this respect. Embodiments of the present invention may be used with other microprocessors having cores other than an ARM based core, for example, a MIPS based core, x86 based core, etc. Further, embodiments of the present invention may also be used with 4-bit, 8-bit, 16-bit or 64-bit microprocessors. In some embodiments, one or two 16 bit processors with a 16 bit or 32 bit bus may be used.

Although the scope of the present invention is not limited in this respect, in some embodiments, RAM 130 may be a volatile memory such as, for example, a static random access memory (SRAM) or a dynamic random access memory (DRAM). In some embodiments, RAM 130 may have relatively faster access times such as, for example, read and write times, compared to nonvolatile memory 120 and may serve as a cache memory to cache information from nonvolatile memory 120.

In some embodiments, nonvolatile memory 120 may be a NAND or NOR type of flash electrically erasable programmable read-only memory, and may be a single bit per cell memory capable of storing one bit of information per memory cell or multiple bits per cell memory capable of storing more than one bit of information per memory cell. Nonvolatile memory 120 may include a memory array 140 that is structured or arranged into one or more memory blocks. In one embodiment, nonvolatile memory 120 may comprise a plurality of blocks 151-158 of memory, wherein each block includes a plurality of nonvolatile memory cells such as, for example, flash memory cells, capable of storing at least one bit of information. In some embodiments, the size of each block of nonvolatile memory 120 is fixed at approximately 128 kilobytes (Kbytes)

Although nonvolatile memory 120 is illustrated as including eight memory blocks in FIG. 1, this is not a limitation of the present invention. In alternate embodiments, nonvolatile memory 120 may include fewer or more than eight blocks. Although the scope of the present invention is not limited in this respect, in some embodiments, array 140 may include 132 blocks of memory, wherein each block of memory may range in size from about 16 kilobytes (Kbytes) to about one megabyte (Mbyte).

Physical addresses may be used by code such as, for example, memory management software executing or running on a component external to memory 120 such as, for example, processor 110, to access information stored in the memory blocks of memory 120. Although the scope of the present invention is not limited in the respect, as an example, each memory block of array 140 may be capable of storing about 128 kilobytes of information, and the information stored in a block may be byte accessible. In other words, each block of memory may be mapped to a specified range of physical addresses and information may be accessed at a byte level, that is, on a byte-by-byte basis using the physical addresses.

In the embodiments wherein nonvolatile memory 120 is a flash memory, nonvolatile memory 120 may only be erasable at a block level, that is, on a block-by-block basis, as opposed to a bit level or byte level. In some embodiments, memory management software that is running on processor 110 may initiate an erase operation to a selected block of array 140. The erase operation may include sending an erase command over bus 125 to data pins (not shown) of memory 120 and an address within the address range mapped to the targeted erase block to address pins (not shown) of memory 120. Nonvolatile memory 120 may decode the erase command and address from processor 110 using, for example, a controller (not shown) of memory 120, and perform the erasing of the targeted block.

Information may be written into free space of a flash memory. Free space in a flash memory may be any erased area in the flash memory. In accordance with one convention, flash memories are said to be erased when all cells in a particular area store a logic one. Writing to a particular location in the flash memory may include writing a logic zero to one or more cells of that particular location.

Although nonvolatile memory 120 is discussed as a flash memory, this is not a limitation of the present invention. In other embodiments, nonvolatile memory 120 may be another type of memory capable of storing data when power is removed from the memory. For example, nonvolatile memory 120 may be a ferroelectric random access memory (FRAM), a magnetic random access memory (MRAM), or any other nonvolatile device capable of storing code, data, and/or files.

In various embodiments, the components of system 100 may be integrated together on a single semiconductor die, or in alternate embodiments the components may be discrete components. In yet another embodiment, processor 110 and RAM 130 may be integrated together and nonvolatile memory 120 may be a discrete, external ("off-chip") component, although the scope of the present invention is not limited in this respect.

The term "information" may be used to refer to data, instructions, files, or code. Information may be stored in the nonvolatile memory either contiguously or in fragments. Examples of code may include a software application (for example, a downloadable computer game or a word processor program), an operating system (O/S), a java applet, or libraries used by the operating system. Examples of data may include a serial number of a device or encryption keys. If system 100 is used in a wireless telephone, examples of data may include ring tone data or telephone number data. Data or code may be stored using files. Examples of files may include, but is not limited to, audio files, music files, video files, or software application files.

In some embodiments, files may be stored in memory 120 in fragments. The file manager software may receive a request to store a file in nonvolatile memory 120. The file manager software may divide or partition the file into one or more file fragments and store the fragments in one or more blocks of nonvolatile memory 120.

Although the scope of the present invention is not limited in this respect, as an example, if system 100 is used in a cellular phone, a user of the cellular phone may choose to download a music file to the cellular phone from the internet using a web browser application running on the cellular phone. The web browser application may send commands to the file manager software to write or store the file in nonvolatile memory 120. For example, the file manager software may include commands such as "file open," file write," and "file close." These commands may be issued by the web browser application to the file manager software, and the file manager software may execute these commands to store the file in nonvolatile memory 120. Examples of using these commands to write a file to nonvolatile memory 120 will be discussed further below in various embodiments. In some embodiments, the commands may come through intermediate layers on a phone, or with some operating systems, information may be received through a VFS.

Figure 2:
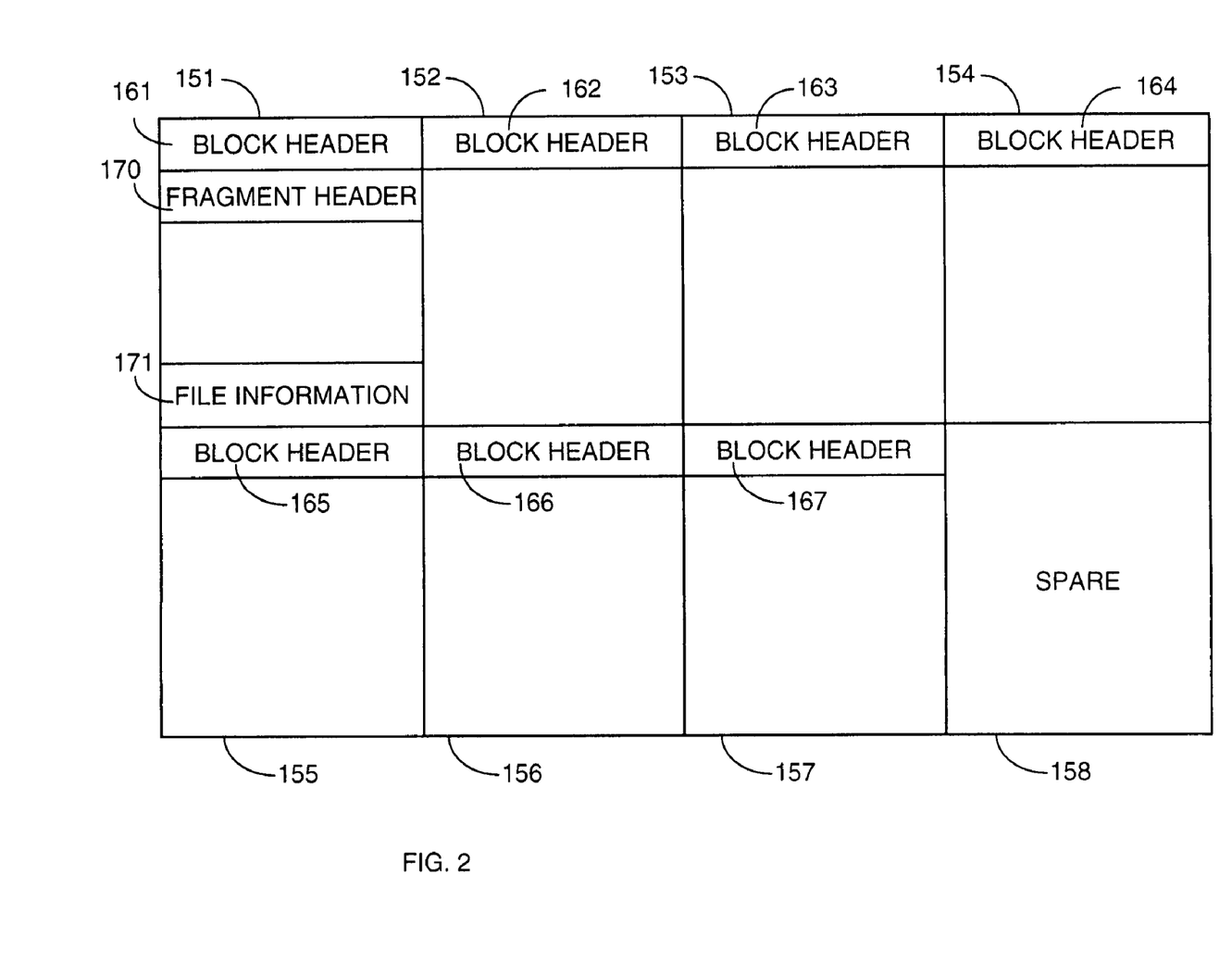
FIG. 2 is a diagram illustrating the writing of a fragment header and file information of a file to a block of a nonvolatile memory in accordance with an embodiment of the present invention.
Figure 3:
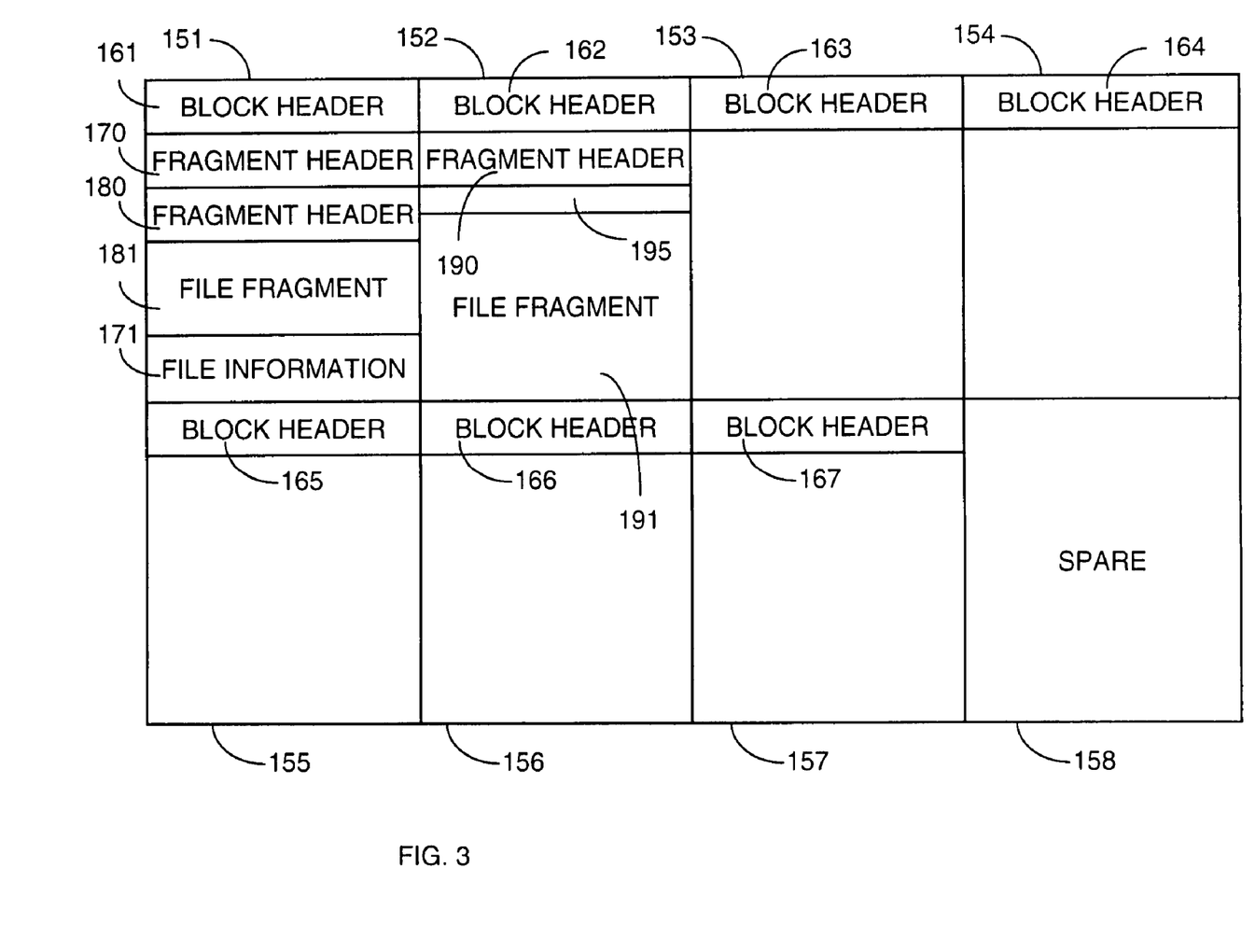
FIG. 3 is a diagram illustrating the writing of additional fragment headers and file fragments of the file to the nonvolatile memory in accordance with an embodiment of the present invention.
Figure 4:
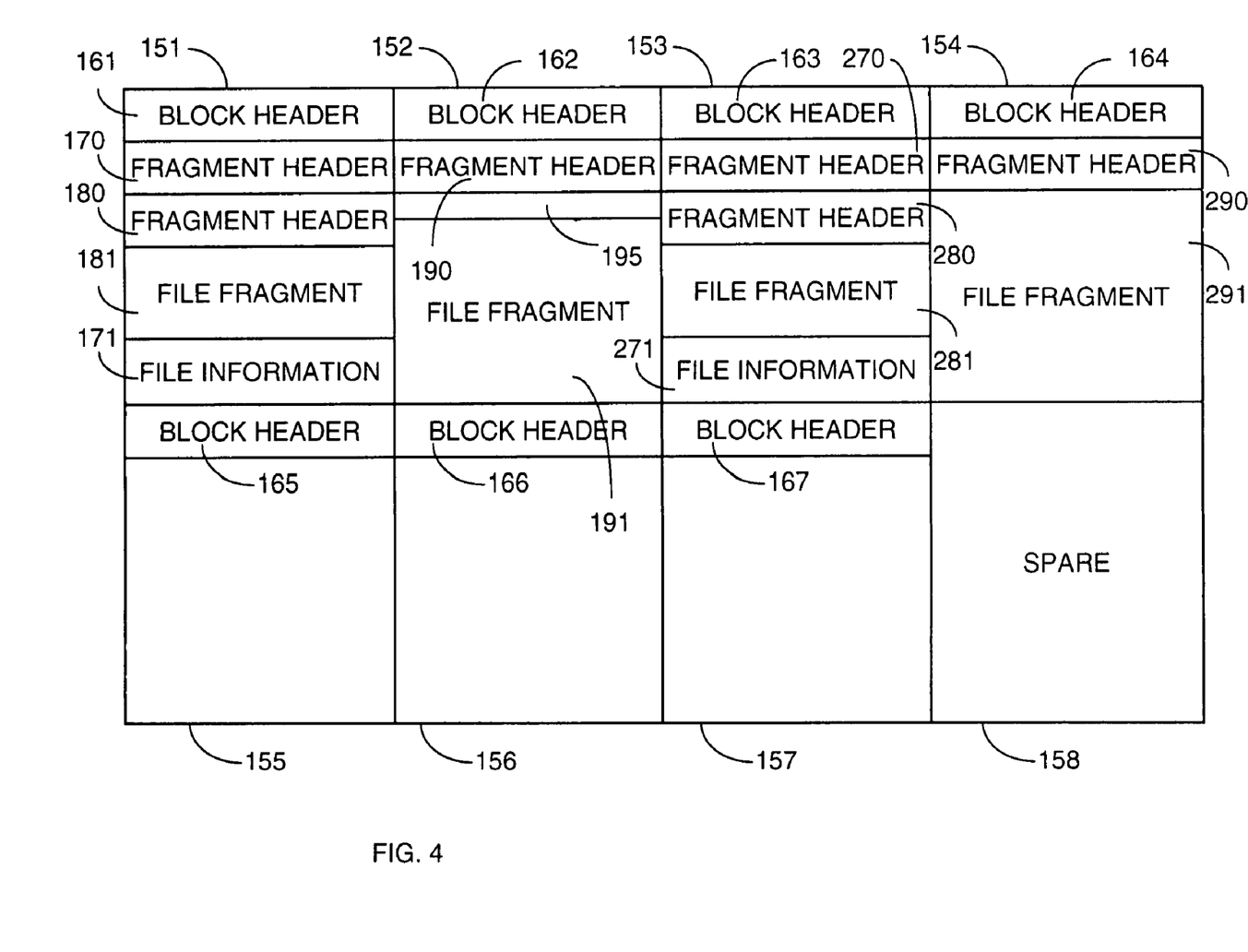
FIG. 4 is a diagram illustrating the writing of fragment headers, file information, and file fragments of another file to the nonvolatile memory in accordance with an embodiment of the present invention.

FIGS. 2, 3 and 4 will be used to discuss embodiments for writing files to nonvolatile memory 120 in accordance with embodiments of the present invention. FIGS. 2-4 show blocks 151-158 of nonvolatile memory 120 at various points in time after the writing of information to one or more of these blocks. Turning to FIG. 2, this figure shows blocks 151-158 after the writing of a fragment header 170 and file information 171 in accordance with an embodiment of the present invention.

As is illustrated in FIG. 2, each of blocks 151-157 may respectively include block headers 161-167. Block headers 161-167 may include information about the block in which the block header is stored.

Writing a file to nonvolatile memory 120 may include dividing or breaking the file up into one or more file fragments and using one or more fragment headers, and storing these file fragments and fragment headers in one or more blocks of nonvolatile memory 120.

In various embodiments, each fragment header corresponds to, or is associated with, one file fragment and the size of each fragment header is fixed. Each fragment header may include information about the corresponding file fragment. Although the scope of the present invention is not limited in this respect, each fragment header may include the size of the corresponding file fragment, the location of the corresponding file fragment in a block of nonvolatile memory 120 (e.g., byte offset in the block where the corresponding file fragment starts), an identifier to identify the file to which the corresponding file fragment belongs to (e.g., ID of the file that the corresponding file fragment belongs to), and the position of the corresponding file fragment in the file relative to all other file fragments (e.g., instance number or class information describing what component of the file the corresponding file fragment belongs to). Some of the information stored in the fragment headers may be used to link or tie the file fragments together.

Each fragment header may also include a status field or status information, for example, one or more status bits that may indicate the status or state of a corresponding file fragment. Although the scope of the present invention is not limited in this respect, in one embodiment, the fragment header may include 16 status bits and may correspond to the following status states as shown below in Table 1.

TABLE 1

| STATUS STATE | FRAGMENT HEADER STATUS BITS |
| --- | --- |
| Empty | 1111111111111111b |
| Header Allocating | 1111111111111100b |
| Write In Progress | 1111111111000000b |
| Valid | 1111111100000000b |
| Invalidating | 1111000000000000b |
| Invalid | 0000000000000000b |
| Header Invalidating | 0011111111111100b |

Although fragment headers have been illustrated in one embodiment as including 16 status bits corresponding to seven status states, this is not a limitation of the present invention. In other embodiments, fewer or more than 16 status bits may be used and fewer or more than seven status states may be used.

The file manager software may include a power loss recovery (PLR) algorithm or scheme to identify corrupt files or invalid files generated by the loss of power to nonvolatile memory 120 during the writing of a file to nonvolatile memory 120. In some embodiments, the PLR scheme may include using only information stored in one fragment header to determine if the writing of the entire file to nonvolatile memory 120 was interrupted by a loss of power, wherein the information stored in the one header is power loss recovery (PLR) information for all the file fragments stored in nonvolatile memory 120. In other words, only one fragment header includes PLR information for the entire file, and no other fragment headers associated with that file include PLR information. In some embodiments, the one fragment header used to determine if the writing of the entire file was interrupted by a loss of power may be the initial fragment header allocated for the file. This PLR scheme may be referred to as a file level PLR scheme.

Compare a file level PLR scheme to another scheme which may be referred to as a fragment level PLR scheme that may include storing a file using multiple file fragments and multiple fragment headers, and wherein PLR information is stored in each fragment header for each file fragment. By using only one header to store PLR information for all file fragments, this may reduce the amount of time to write a file to nonvolatile memory 120 since PLR information is not tracked for each file fragment but rather is tracked only at the file level.

Continuing with the example from above, the writing of a file to nonvolatile memory 120 may begin with issuing a "file open" command to the file manager software. The file to be written to nonvolatile memory 120 may be a read-only file or a write once read many (WORM) file that is only written to nonvolatile memory 120 and is not edited after the file is written to nonvolatile memory 120. Examples of a read-only or WORM file may include an audio file, video file, picture file, or a software application file.

The file open command may include creating or allocating fragment header 170 in block 151 and storing file information 171 associated with the file to be stored in nonvolatile memory 120.

Allocating fragment header 170 may include altering at least one status bit of the status information of fragment header 170 to indicate that fragment header 170 is allocated. In other words, one of the status bits of fragment header 170 may be changed from one logic value to another logic value to denote that that header 170 is in a "Header Allocating" state. Altering one status bit of fragment header 170 may include changing the memory state of a status bit from a logic one to a logic zero. Although the scope of the present invention is not limited in this respect, in one example, this may include transitioning the status state of fragment header 170 from an "Empty" state to a "Header Allocating" state using, for example, the status bits shown in Table 1 above.

After fragment header 170 is allocated, file information 171 associated with the file to be stored in nonvolatile memory 120 may be stored in block 151. Although the scope of the present invention is not limited in this respect, in some embodiments, file information 171 may include the name of the file to be stored in nonvolatile memory 120, the time the file was created, and the date the file was created. In addition, in some embodiments, the size of the file information may be fixed.

Fragment header 170 corresponds to file information 171. The status bits of fragment header 170 may be used to track the status or the state of the writing of the entire file, that is, all the file fragments of the file, to nonvolatile memory 120. After file information 171 is written to block 151, another status bit of the fragment header 170 may be altered to indicate that the writing of the entire file is in progress. In other words, the status state of fragment header 170 may be changed to indicate that the file is in a "Write In Progress" (WIP) state using, for example, the status bits shown in Table 1 above.

Although the scope of the present invention is not limited in this respect, block 158 may be a spare erased block that may be used to reclaim space occupied by invalid data stored in blocks 151-157.

Turning to FIG. 3, shown is memory blocks 151-158 after the writing of fragment headers 180 and 190 and file fragments 181 and 191 in accordance with an embodiment of the present invention. Area 195 of block 152 may be free space or erased space in block 152.

After the state of fragment header 170 is changed to indicate that the file is in a WIP state, then a "file write" command may be issued to the file manager software. The file write command may include writing all the file fragments of the file and all the corresponding fragment headers to nonvolatile memory 120. For example, file write may being with allocating fragment header 180 to block 151, which may include altering at least one status bit of the status information of fragment header 180 to indicate that fragment header 180 is allocated. For example, at least one of the status bits of fragment header 180 may be changed from a logic one to a logic zero to denote that that header 180 is in a "Header Allocating" state using, for example, the status bits shown in Table 1 above.

After fragment header 180 is allocated, the initial file fragment, i.e., file fragment 181, of the file to be written to nonvolatile memory 120 may be written to block 151. File fragment 181 may be associated with fragment header 180 and the status bits of fragment header 180 may be used to track status of the file fragment 181. Fragment header 180 may include the size of corresponding file fragment 181, the location or offset of file fragment 181 in block 151, the ID of the file to which file fragment 181 belongs to, and the instance number or position of file fragment 181 in the file relative to all other file fragments of the file.

In some embodiments, the size of each file fragment may be variable. For example, the size of each file fragment may be approximately equal to or less than the size of a block of memory in which the file fragment is stored. In the example illustrated in FIG. 3, the file manager software determines how much free space, i.e., erased space, is available in block 151 after the writing of fragment header 170, file information 171, and fragment header 180. After determining the amount of free space available in block 151, the file manager software generates and writes file fragment 181 which is equal is size to the amount of available free space in block 151.

After the writing of file fragment 181 to block 151, the state of fragment header 180 may be updated to a "Valid" state by, for example, altering at least one status bit of the status information of fragment header 180 to indicate that file fragment 181 is valid.

Assuming the remaining portion of the file to be written is less than the amount of free space available in block 152, then only one more file fragment is used to write the file to nonvolatile memory 120. After the writing of file fragment 181 to block 151 and the updating of fragment header 180 to a valid state, fragment header 190 may be allocated to block 152, which may include altering at least one status bit of the status information of fragment header 190 to indicate that fragment header 190 is allocated. For example, at least one of the status bits of fragment header 190 may be changed from a logic one to a logic zero to denote that that header 190 is in a "Header Allocating" state.

After fragment header 190 is allocated, the final or last file fragment, that is, file fragment 191, of the file to be written to nonvolatile memory 120 may be written to block 152. File fragment 191 may be associated with fragment header 190 and the status bits of fragment header 190 may be used to track status of the file fragment 191. After the writing of file fragment 191 to block 152, the state of corresponding fragment header 190 may be updated to a "Valid" state by, for example, altering at least one status bit of the status information of fragment header 190 to indicate that file fragment 191 is valid.

After the writing of the last file fragment, e.g., file fragment 191, to block 152, then a "file close" command may be issued to the file manager software. In response to receiving the file close command, the file manager software may update the initial fragment header, e.g., fragment header 170, associated with file information 171 from a "WIP" state to a "Valid" state, using, for example, the status bits shown in Table 1 above. Updating fragment header 170 may include altering at least one status bit of the status information of fragment header 170 after the last file fragment 191 is written to block 152 to indicate that writing of the entire file to nonvolatile memory 120 is complete and to indicate that the file is valid.

Accordingly, fewer fragment header updates may be used during the writing of a file with the file level PLR scheme disclosed above compared to some fragment level PLR schemes. For example, as discussed in some of the embodiments above, assuming no power loss during the writing of a file to nonvolatile memory 120, only the initial fragment header associated with the file stored in nonvolatile memory transitions through three states, e.g., "Header Allocating," "Write In Progress," and "Valid" during the writing of the entire file. All subsequent fragment headers associated with the file are only transition through two states, e.g., "Header Allocating" and "Valid."

Turning to FIG. 4, this figure shows blocks 151-158 after the writing of an additional file to nonvolatile memory 120 in accordance with an embodiment of the present invention. Although the scope of the present invention is not limited in this respect, the writing of another file, for example, a music file, may be done by writing an initial fragment header 270 and corresponding file information 271 to block 153.

The initial fragment header 270 may correspond to file information 271 and may include PLR information for the entire music file. The state of the initial fragment header 270 may be denoted as a "Write In Progress" state after the writing of the corresponding file information 271. Then, fragment header 280 may be allocated and followed by the storing of file fragment 281 in block 153. File fragment 281 may correspond to fragment header 280 and after the storing of file fragment 281, the status bits of fragment header 280 may be updated to change the state of fragment header 280 to a "Valid" state. For example at least one of the status bits of fragment header 280 may be changed to indicate a "Valid" state.

After updating the status bits of fragment header 280, fragment header 290 and the last file fragment of the music file, that is, file fragment 291, may be written to block 154. File fragment 291 may correspond to fragment header 290 and after the storing of file fragment 291, the status bits of fragment header 290 may be updated to change the state of fragment header 290. For example, at least one of the status bits of fragment header 290 may be changed to indicate a "Valid" state. After the writing of the last file fragment 291 to block 154, then the file manager software may update the initial fragment header 270 of the music file from a "WIP" state to a "Valid" state.

After the writing of all the file fragments of a particular file, the PLR scheme implemented by the file manager software may include scanning all the status bits of all fragment headers stored in nonvolatile memory 120 upon power up or initialization of nonvolatile memory 120 to determine if files stored in nonvolatile memory 120 are valid or corrupted due, for example, to a loss of power during the writing of a file.

The PLR scheme may also include altering at least one bit of the status bits of all headers corresponding to the file stored in nonvolatile memory 120 to indicate that the corresponding file fragments are "Invalid" if the status bits of the initial header of the file indicate that the writing of the file is in progress. In other words, the status bits of all fragment headers corresponding to the file may be modified to indicate that the status of all corresponding file fragments is "Invalid" if the status bits of the initial fragment header denote that the file is in a "WIP" state.

In addition, in some embodiments, the status bits of all fragment headers corresponding to a file may be altered to denote an "Invalid" state if a request is sent to the file manager software to delete a particular file. A reclaim operation may be performed to reclaim invalid file fragments at a later point in time using, for example, spare block 158.

In some embodiments, the storing of files in nonvolatile memory 120 may be accomplished without the use of tables such as, for example, sequence tables or group tables, stored in nonvolatile memory 120. These tables may be used to tie or link all the file fragments of a particular file together. Rather, in some embodiments, a table stored in RAM 130 may be used to tie or link file fragments together using, for example, information stored in the fragment headers which are stored in nonvolatile memory 120.

In some embodiments, during the power up or initialization of nonvolatile memory 120, a table or data structure may be stored in RAM 130 to link all the file fragments of a file together, wherein the RAM table includes locations in nonvolatile memory 120 of all the file fragments. The table stored in RAM 130 may be populated at initialization or power up of nonvolatile memory 120 using, for example, information stored in the fragment headers.

Although the scope of the present invention is not limited in this respect, as an example, the table stored in RAM 130 to link together file fragments for a particular file may be generated using the following information from the fragment headers: the size of the corresponding file fragment, the location of the corresponding file fragment in a block of nonvolatile memory 120 (e.g., byte offset in the block where the corresponding file fragment starts), an identifier to identify the file to which the corresponding file fragment belongs to (e.g., ID of the file that the corresponding file fragment belongs to), and the position of the corresponding file fragment in the file relative to all other file fragments (e.g., instance number or class information describing what component of the file the corresponding file fragment belongs to).

Writing time of a file to nonvolatile memory 120 may be decreased, in that, by using tables stored in RAM 130 rather than tables stored in nonvolatile memory 120, this may result in fewer write operations to nonvolatile memory 120 during the writing of a file. As may be appreciated, a sequence table stored in nonvolatile memory 120 may need associated fragment headers and PLR information which may need to be updated. These fragment headers and associated header updates for the PLR information may be eliminated by using RAM tables to link file fragments together, thereby improving write performance for writing files to nonvolatile memory 120.

Accordingly, the time to write a file to nonvolatile memory 120 may be reduced using various embodiments discussed above. This may be accomplished by, for example, using only one header to track or store PLR information for the writing of a file, which may result in fewer fragment header updates during the writing of the file. In addition, allowing the file fragment size to be variable and as large as a block may result in fewer headers compared to systems that use relatively small fixed sized headers of, for example, one kilobyte in size. Also, not having sequence tables stored in nonvolatile memory 120 to link file fragments of a file together may reduce the amount of writing to nonvolatile memory 120 during the writing of a file, thereby resulting in a faster write time.

As is discussed above in some of the embodiments, a file level PLR algorithm is provided. The file level PLR may include writing a file to a nonvolatile memory using a plurality of headers and a plurality of file fragments, wherein information stored in one header of the plurality of headers is power loss recovery (PLR) information for the entire file, that is, for all the file fragments.

Figure 5:
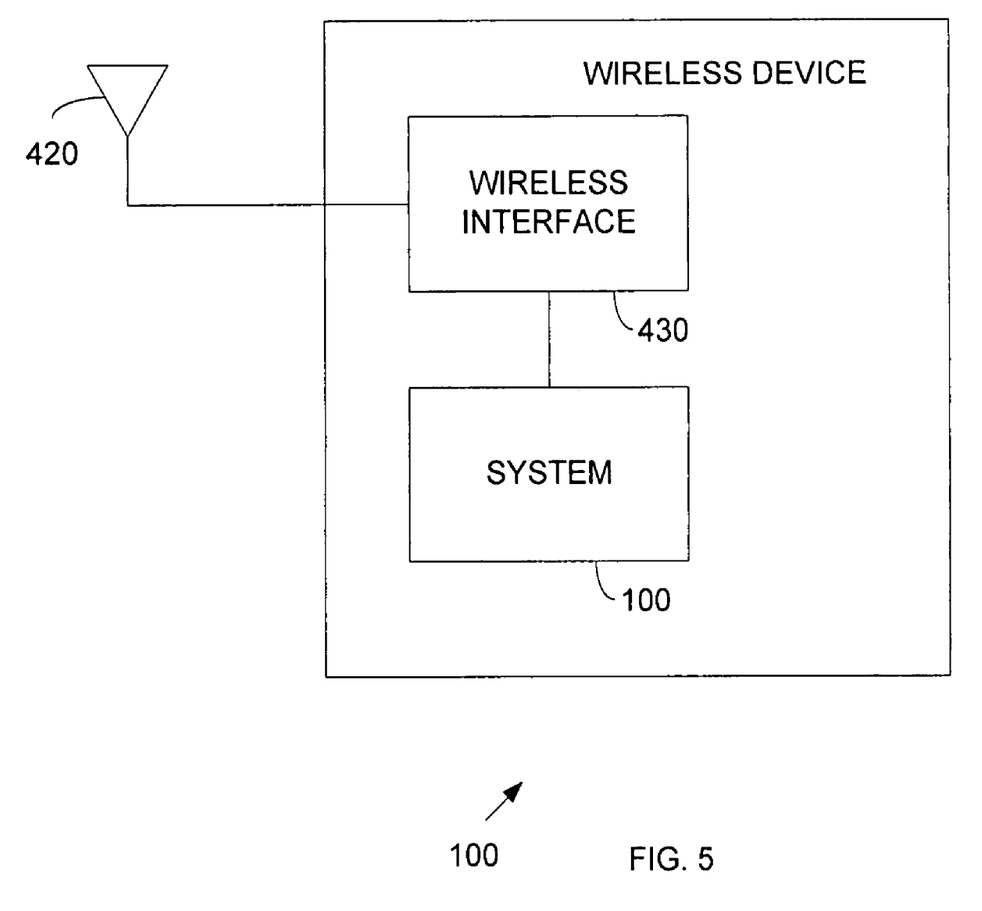
FIG. 5 is a block diagram illustrating a wireless device in accordance with an embodiment of the present invention.

Turning to FIG. 5, a block diagram illustrating a wireless device 400 in accordance with an embodiment of the present invention is shown. In one embodiment, wireless device 500 may use the methods discussed above and may include computing system 100 (FIG. 1).

As is shown in FIG. 5, wireless device 400 may include an antenna 420 coupled to a processor of system 100, for example, processor 110 (FIG. 1), via a wireless interface 430. In various embodiments, antenna 420 may be a dipole antenna, helical antenna or another antenna adapted to wirelessly communicate information. Wireless interface 430 may be adapted to process radio frequency (RF) and baseband signals using wireless protocols and may include baseband circuitry and a wireless transceiver.

Wireless device 400 may be a personal digital assistant (PDA), a laptop or portable computer with wireless capability, a web tablet, a wireless telephone (for example, cordless or cellular phone), a pager, an instant messaging device, a digital music player, a digital camera, or other devices that may be adapted to transmit and/or receive information wirelessly. Wireless device 400 may be used in any of the following systems: a wireless personal area network (WPAN) system, a wireless local area network (WLAN) system, a wireless metropolitan area network (WMAN) system, or a wireless wide area network (WWAN) system such as, for example, a cellular system.

An example of a WLAN system includes a system substantially based on an Industrial Electrical and Electronics Engineers (IEEE) 802.11 standard. An example of a WMAN system includes a system substantially based on an Industrial Electrical and Electronics Engineers (IEEE) 802.16 standard. An example of a WPAN system includes a system substantially based on the Bluetooth™ standard (Bluetooth is a registered trademark of the Bluetooth Special Interest Group). Another example of a WPAN system includes a system substantially based on an Industrial Electrical and Electronics Engineers (IEEE) 802.15 standard such as, for example, the IEEE 802.15.3a specification using ultrawideband (UWB) technology.

Examples of cellular systems include: Code Division Multiple Access (CDMA) cellular radiotelephone communication systems, Global System for Mobile Communications (GSM) cellular radiotelephone systems, Enhanced data for GSM Evolution (EDGE) systems, North American Digital Cellular (NADC) cellular radiotelephone systems, Time Division Multiple Access (TDMA) systems, Extended-TDMA (E-TDMA) cellular radiotelephone systems, GPRS, third generation (3G) systems like Wide-band CDMA (WCDMA), CDMA-2000, Universal Mobile Telecommunications System (UMTS), or the like.

Although computing system 100 is illustrated as being used in a wireless device in one embodiment, this is not a limitation of the present invention. In alternate embodiments system 100 may be used in non-wireless devices such as, for example, a server, a desktop, or an embedded device not adapted to wirelessly communicate information.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A method, comprising:

writing a file to a nonvolatile memory using a plurality of headers and a plurality of file fragments; and using only information stored in one header of the plurality of headers to determine if the writing of the file to the nonvolatile memory was interrupted by a loss of power wherein the nonvolatile memory includes a plurality of blocks, wherein the one header is a first header of the plurality of headers, and wherein writing includes:

dividing the file into the plurality of file fragments;

allocating the first header of the plurality of headers in a first block of the plurality of blocks, wherein the first header includes a plurality of status bits and wherein allocating includes altering a first status bit of the plurality of status bits of the first header to indicate that the first header is allocated;

storing file information of the file in the first block of the plurality of blocks, wherein the first header corresponds to the file information and wherein the plurality of status bits of the first header indicates status of the writing of all file fragments of the file to the nonvolatile memory; and altering a second status bit of the plurality of status bits of the first header to indicate that writing of the file is in progress.

2. The method of claim 1, wherein information stored in the one header of the plurality of headers is power loss recovery (PLR) information for all the file fragments of the plurality of file fragments.

3. The method of claim 1, wherein a second header of the plurality of headers does not include power loss recovery (PLR) information.

4. The method of claim 1, wherein no other headers associated with any file fragments of the file other than the one header include power loss recovery (PLR) information.

5. The method of claim 1, wherein each header of the plurality of headers corresponds to one file fragment of the plurality of file fragments and wherein the size of each header of the plurality of headers is fixed.

6. The method of claim 5, wherein each header of the plurality of headers includes information about the corresponding file fragment.

7. The method of claim 5, wherein each header of the plurality of headers includes size of the corresponding file fragment, the location of the corresponding file fragment in a block of the nonvolatile memory, an identifier to identify the file to which the corresponding file fragment belongs to, and the position of the corresponding file fragment in the file relative to all other file fragments.

8. The method of claim 1, wherein the size of each file fragment of the plurality of file fragments is variable.

9. The method of claim 1, wherein the nonvolatile memory includes a plurality of blocks, the size of each file fragment of the plurality of file fragments is approximately equal to or less than the size of a block, wherein the size of each block of the plurality of blocks is fixed.

10. The method of claim 9, wherein each block of the plurality of blocks includes a plurality of nonvolatile flash memory cells and wherein each block of the plurality of blocks stores a plurality of bytes of information and wherein each byte of the plurality of bytes of information may be accessed using one of a plurality of physical addresses.

11. The method of claim 9, wherein the nonvolatile memory includes at least about 128 blocks, wherein each block of the plurality of blocks is at least about 16 kilobytes in size, and wherein the nonvolatile memory is erasable only at a block level.

12. The method of claim 1, wherein altering the first status bit of the plurality of status bits of the first header includes changing a memory state of the first status bit from a logic one to a logic zero.

13. The method of claim 1, further comprising:

allocating a second header of the plurality of headers in the first block of the plurality of blocks, wherein the second header includes a plurality of status bits and wherein allocating includes altering a first bit of the plurality of status bits of the second header to indicate that the second header is allocated;

writing a first file fragment of the plurality of file fragments to the first block, wherein the first file fragment is associated with the second header and wherein the plurality of status bits of the second header are used to track status of the first file fragment; and altering a second bit of the plurality of status bits of the second header to indicate the first file fragment is valid.

14. The method of claim 13, further comprising:

altering a third bit of the plurality of status bits of the first header after the last file fragment of the plurality of file fragments is written to the nonvolatile memory to indicate that the file is valid.

15. The method of claim 1, wherein using only information stored in the one header includes:

scanning the plurality of status bits of the first header upon power up of the nonvolatile memory to determine if the file stored in the nonvolatile memory is valid; and altering at least one bit of plurality of status bits of all headers of the plurality of headers corresponding to the file stored in the nonvolatile memory to indicate that the corresponding file fragments are invalid if the plurality of status bits of the first header indicate that the writing of the file is in progress.

16. The method of claim 1, wherein die plurality of status bits of the first header is power loss recovery (PLR) information for the entire file.

17. The method of claim 1, wherein file information includes the name of the file, the time the file was created, and the date the file was created and wherein the size of the file information is fixed.

18. The method of claim 1, further comprising generating a table stored in a volatile memory to link all the file fragments of the plurality of file fragments together, wherein the table includes locations in the nonvolatile memory of all the file fragments and wherein the table is populated at initialization of the nonvolatile memory using information stored in the plurality of headers.

19. The method of claim 1, wherein the file is a read-only file.

20. The method of claim 1, wherein the file is an audio file, video file, picture file, or a software application file.

* * * * *